(12) United States Patent
Koja

(10) Patent No.: US 12,260,920 B2
(45) Date of Patent: Mar. 25, 2025

(54) SEMICONDUCTOR APPARATUS AND SYSTEM

(71) Applicant: ROHM Co., LTD., Kyoto (JP)

(72) Inventor: Nozomu Koja, Kyoto (JP)

(73) Assignee: ROHM Co., Ltd., Kyoto (JP)

( * ) Notice: Subject to any disclaimer, the term of this patent is extended or adjusted under 35 U.S.C. 154(b) by 68 days.

(21) Appl. No.: 18/355,642

(22) Filed: Jul. 20, 2023

(65) Prior Publication Data

US 2024/0029799 A1    Jan. 25, 2024

(30) Foreign Application Priority Data

Jul. 22, 2022    (JP) .................................. 2022-117249

(51) Int. Cl.
| | | |
|---|---|---|
| G11C 16/30 | (2006.01) | |
| G11C 16/10 | (2006.01) | |
| G11C 16/12 | (2006.01) | |

(52) U.S. Cl.
CPC ............ G11C 16/30 (2013.01); G11C 16/102 (2013.01); G11C 16/12 (2013.01)

(58) Field of Classification Search
CPC ....... G11C 16/30; G11C 16/102; G11C 16/12; G11C 5/148
See application file for complete search history.

(56) References Cited

U.S. PATENT DOCUMENTS

| | | | | |
|---|---|---|---|---|
| 5,600,728 A | * | 2/1997 | Satre ..................... | H04R 25/505 |
| | | | | 381/314 |
| 2002/0186602 A1 | * | 12/2002 | Ooishi ................. | G11C 29/028 |
| | | | | 365/201 |
| 2004/0017690 A1 | * | 1/2004 | Lee ......................... | G11C 5/147 |
| | | | | 365/145 |
| 2019/0355395 A1 | * | 11/2019 | Jeong ..................... | G11C 16/30 |

FOREIGN PATENT DOCUMENTS

JP            7021873            2/2022

* cited by examiner

*Primary Examiner* — Jay W. Radke
(74) *Attorney, Agent, or Firm* — CHIP LAW GROUP

(57) ABSTRACT

Provided is a semiconductor apparatus including a power supply pin configured to receive a power supply voltage from an outside, a capacitor connection pin to be connected with a capacitor, a power supply circuit having an input connected to the power supply pin and having an output connected to the capacitor connection pin, the power supply circuit being configured to generate an internal power supply voltage at the output of the power supply circuit, a nonvolatile memory configured to operate by receiving the internal power supply voltage, a switch disposed between a power supply terminal of the nonvolatile memory and the capacitor connection pin, and, a control unit configured to turn on the switch when the internal power supply voltage exceeds a predetermined threshold value.

13 Claims, 8 Drawing Sheets

SEMICONDUCTOR APPARATUS AND SYSTEM

CROSS REFERENCE TO RELATED APPLICATIONS

This application claims priority benefit of Japanese Patent Application No. JP 2022-117249 filed in the Japan Patent Office on Jul. 22, 2022. Each of the above-referenced applications is hereby incorporated herein by reference in its entirety.

BACKGROUND

The present disclosure relates to a semiconductor apparatus including a nonvolatile memory.

In an electronic apparatus, a nonvolatile memory is used to store various kinds of settings and a program to be executed. Some semiconductor apparatuses have a multi-chip configuration, which includes, in one package, a chip of a main circuit as a main chip and a chip of a nonvolatile memory storing settings of a processing circuit, for example.

An example of the related art is disclosed in Japanese Patent No. 7021873.

DETAILED DESCRIPTION

Outline of Embodiments

Figure 1:
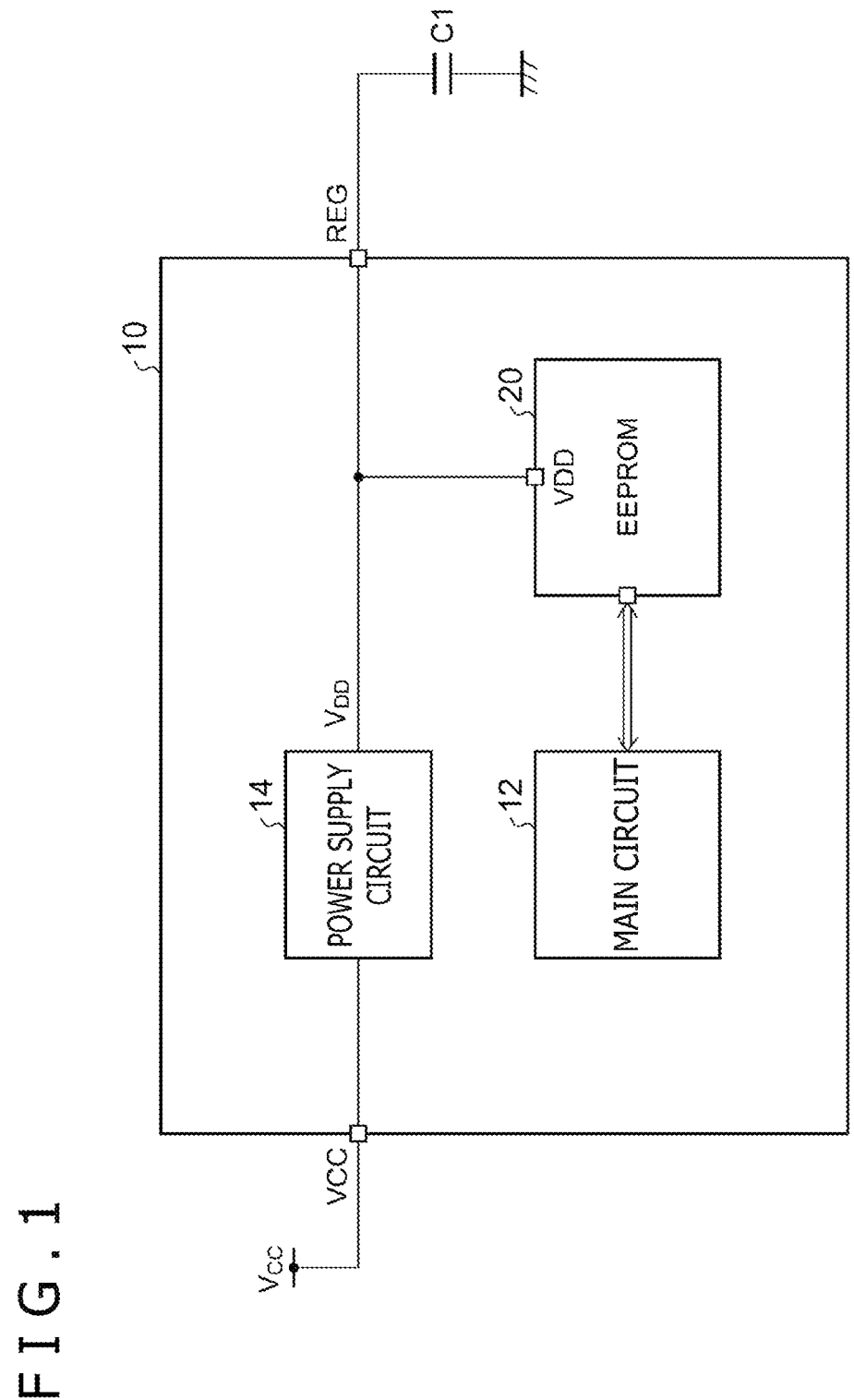
FIG. 1 is a block diagram of a semiconductor apparatus of a multi-chip configuration studied by the present inventor(s)
Figure 2:
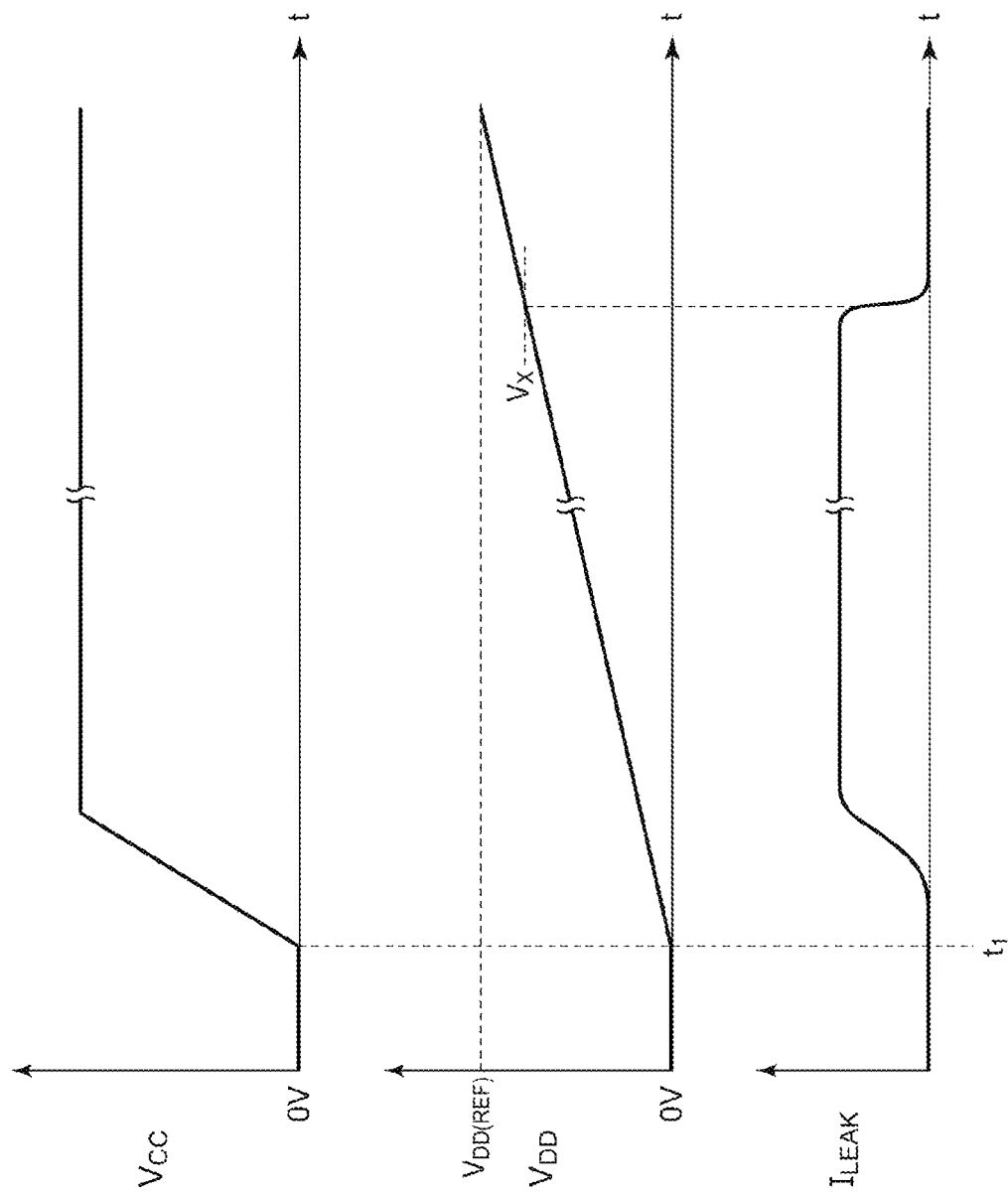
FIG. 2 is a diagram of assistance in explaining a starting operation of the semiconductor apparatus illustrated in FIG. 1.

An outline of some illustrative embodiments of the present disclosure will be described. This outline describes, in a simplified manner, some concepts of one or a plurality of embodiments as an introduction to the following detailed description for the purpose of giving a basic understanding of the embodiments, but does not limit the scope of the technology or the disclosure. This outline neither provides a comprehensive outline of all conceivable embodiments nor is intended to identify important elements of all of the embodiments or demarcate the scope of some or all of modes. For convenience, "one embodiment" may be used to refer to one embodiment (an example or a modification) or a plurality of embodiments (examples or modifications) disclosed in the present specification.

A semiconductor apparatus according to one embodiment includes a power supply pin configured to receive a power supply voltage from an outside, a capacitor connection pin to be connected with a capacitor, a power supply circuit having an input connected to the power supply pin and having an output connected to the capacitor connection pin, the power supply circuit being configured to generate an internal power supply voltage at the output of the power supply circuit, a nonvolatile memory, a switch disposed between a power supply terminal of the nonvolatile memory and the capacitor connection pin, and a control unit configured to turn on the switch when the internal power supply voltage exceeds a predetermined threshold value.

According to this configuration, immediately after a start, the switch is held in an off state, and thus, all of the output current of the power supply circuit is supplied to the capacitor without flowing to the nonvolatile memory. The power supply voltage can hence be raised without being affected by a leakage current of the nonvolatile memory. By then turning on the switch after the power supply voltage is raised to a certain degree, it is possible to shorten a period in which the leakage current flows to the nonvolatile memory, and thus reduce power consumption.

In one embodiment, the power supply circuit, the switch, and the control unit may be integrated on one semiconductor chip.

In one embodiment, the one semiconductor chip may be a microcontroller, and the nonvolatile memory may store a program to be executed by the microcontroller.

In one embodiment, the power supply circuit and the control unit may be included in one microcontroller. A control signal of the switch, the control signal being generated by the control unit, may be output from an input-output terminal of the microcontroller. The nonvolatile memory may store a program to be executed by the microcontroller.

In one embodiment, the nonvolatile memory may include a voltage monitoring circuit configured to compare the internal power supply voltage with a threshold value voltage. The threshold value may be set higher than 80% of the threshold value voltage of the voltage monitoring circuit.

In one embodiment, the threshold value may be variable.

In one embodiment, the nonvolatile memory may be an electrically erasable read-only memory.

Another mode of the present disclosure is a system. This system includes a power supply line, a master circuit configured to generate a power supply voltage in the power supply line, and a plurality of slave circuits connected to the power supply line. Each of the plurality of slave circuits includes a power supply pin connected to the power supply line, a capacitor connection pin connected with a capacitor, a power supply circuit having an input connected to the power supply pin and having an output connected to the capacitor connection pin, the power supply circuit being configured to generate an internal power supply voltage at the output of the power supply circuit, a nonvolatile memory, a switch disposed between a power supply terminal of the nonvolatile memory and the capacitor connection pin, and a control unit configured to turn on the switch when the internal power supply voltage exceeds a predetermined threshold value.

Embodiments

Preferred embodiments will hereinafter be described with reference to the drawings. Identical or equivalent constituent elements, members, and processing illustrated in each drawing are identified by the same reference numerals, and repeated description thereof will be omitted as appropriate. In addition, the embodiments are not restrictive of the disclosure and the technology and are illustrative, and all features described in the embodiments and combinations thereof are not necessarily essential to the disclosure and the technology.

In the present specification, a "state in which a member A is connected to a member B" includes not only a case where the member A and the member B are physically directly connected to each other but also a case where the member A and the member B are indirectly connected to each other via another member that does not essentially affect a state of electric connection between the member A and the member B or does not impair functions or effects produced by the coupling of the member A and the member B.

Similarly, a "state in which a member C is connected (provided) to and between the member A and the member B" includes not only a case where the member A and the member C or the member B and the member C are directly connected to each other but also a case where the member A and the member C or the member B and the member C are indirectly connected to each other via another member that does not essentially affect a state of electric connection between the member A and the member C or the member B and the member C or does not impair functions or effects produced by the coupling of the member A and the member C or the member B and the member C.

Figure 3:
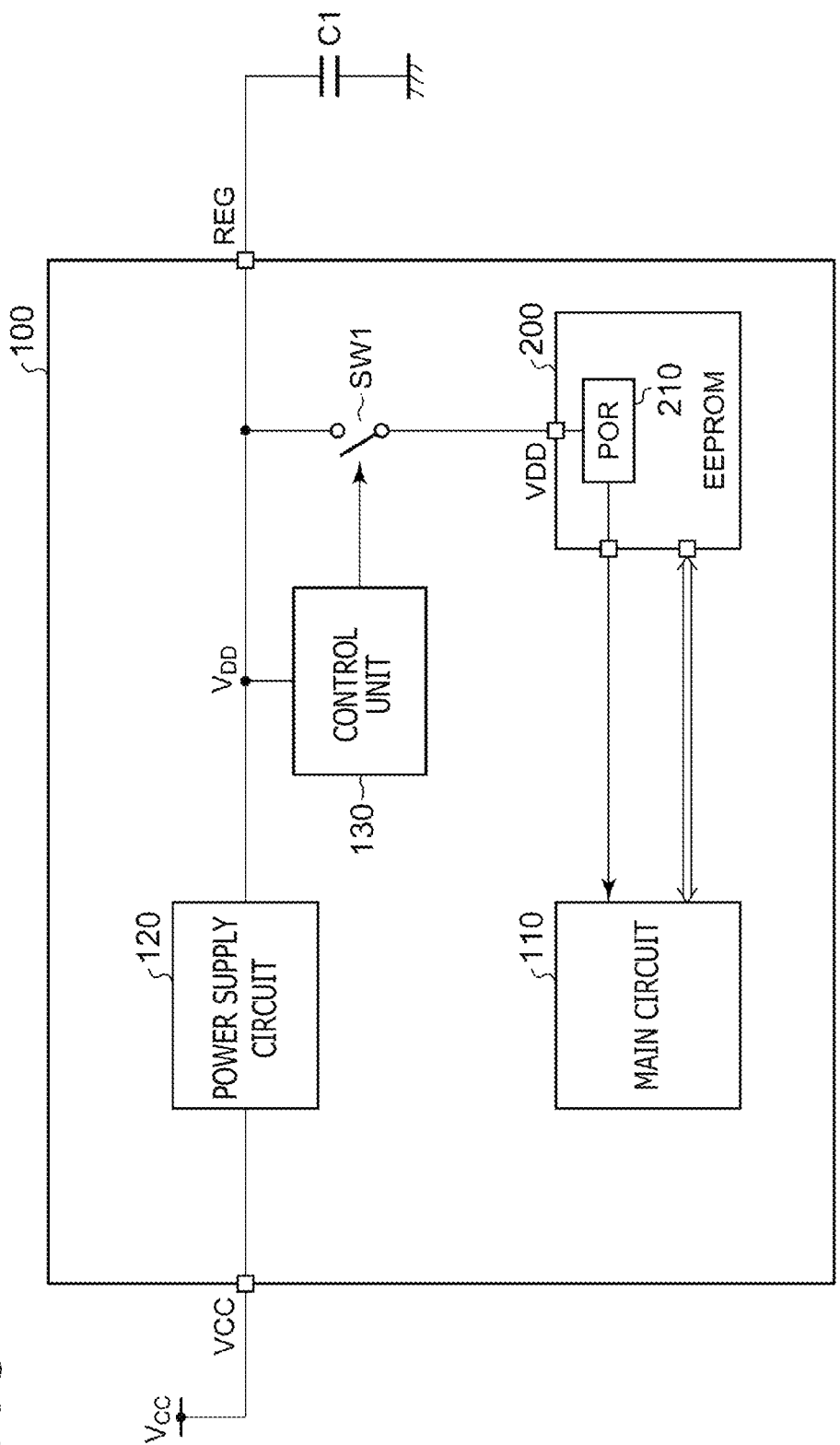
FIG. 3 is a block diagram of a semiconductor apparatus according to an embodiment.

FIG. 3 is a block diagram of a semiconductor apparatus 100 according to an embodiment. The semiconductor apparatus 100 has a power supply pin VCC and a capacitor connection pin REG. The power supply pin VCC is externally supplied with a power supply voltage $V_{CC}$. An external capacitor C1 is connected to the capacitor connection pin REG.

The semiconductor apparatus 100 includes a main circuit 110, a power supply circuit 120, a control unit 130, a switch SW1, and a nonvolatile memory 200. The semiconductor apparatus 100 is housed in one package.

The main circuit 110 is a block having predetermined functions. The functions of the main circuit 110 are not particularly limited to any kind. The semiconductor apparatus 100 is a multi-chip package, in which at least the nonvolatile memory 200 and the main circuit 110 are separate chips. The nonvolatile memory 200 stores settings of the main circuit 110. In a case where the main circuit 110 includes a processor, the nonvolatile memory 200 stores a software program to be executed by the processor of the main circuit 110.

The power supply circuit 120 has an input thereof connected to the power supply pin VCC, and has an output thereof connected to the capacitor connection pin REG. The power supply circuit 120 generates an internal power supply voltage $V_{DD}$ at the output thereof. The internal power supply voltage $V_{DD}$ is smoothed by the capacitor C. The power supply circuit 120 is, for example, a linear regulator. A target level $V_{DD(REF)}$ of the internal power supply voltage $V_{DD}$ is determined according to an operating voltage of the nonvolatile memory 200, and is 5 V, for example. The nonvolatile memory 200 operates by using the internal power supply voltage $V_{DD}$ as a power supply voltage.

The switch SW1 is provided between a power supply terminal of the nonvolatile memory 200 and the capacitor connection pin REG. The control unit 130 controls the switch SW1 according to the internal power supply voltage $V_{DD}$. The control unit 130 compares the internal power supply voltage $V_{DD}$ with a predetermined threshold value $V_{TH}$. The control unit 130 turns off the switch SW1 when $V_{DD}<V_{TH}$ holds. The control unit 130 turns on the switch SW1 when $V_{DD}>V_{TH}$ holds.

The threshold value $V_{TH}$ is preferably determined in reference to a voltage level at which a leakage current $I_{LEAK}$ of the nonvolatile memory 200 ceases to flow, that is, in reference to an upper limit level Vx of an indeterminate voltage range. For example, in a case where the upper limit level Vx of the indeterminate voltage range is 3 V, the threshold value $V_{TH}$ is preferably set to approximately 3 V.

The nonvolatile memory 200 may include a voltage monitoring circuit 210 that monitors the internal power supply voltage $V_{DD}$. The voltage monitoring circuit 210 is a power-on reset circuit. When the internal power supply voltage $V_{DD}$ exceeds a threshold value voltage $V_{POR}$, the voltage monitoring circuit 210 asserts a power-on reset signal POR. The threshold value voltage $V_{POR}$ is set to a level slightly higher than the voltage level Vx at which the state of a gate element constituting the nonvolatile memory 200 is determined.

When the POR signal is asserted, the nonvolatile memory 200 becomes accessible. When the POR signal is asserted, the main circuit 110 starts access to the nonvolatile memory 200.

The threshold value $V_{TH}$ of the control unit 130 may be set higher than 80% of the threshold value voltage $V_{POR}$ of the voltage monitoring circuit 210. For example, the threshold value $V_{TH}$ of the control unit 130 may be approximately set as follows.

$$V_{POR} \times 0.8 \leq V_{TH} \leq V_{POR} \times 1.2$$

The voltage level Vx, at which the state of the gate element constituting the nonvolatile memory 200 is determined, and the threshold value voltage $V_{POR}$ of the voltage monitoring circuit 210 have correlation to each other. In a case where $V_{TH}=V_{POR}$ holds, $V_{DD}>V_{TH}$ ensures that no leakage current flows to the nonvolatile memory 200.

Figure 4:
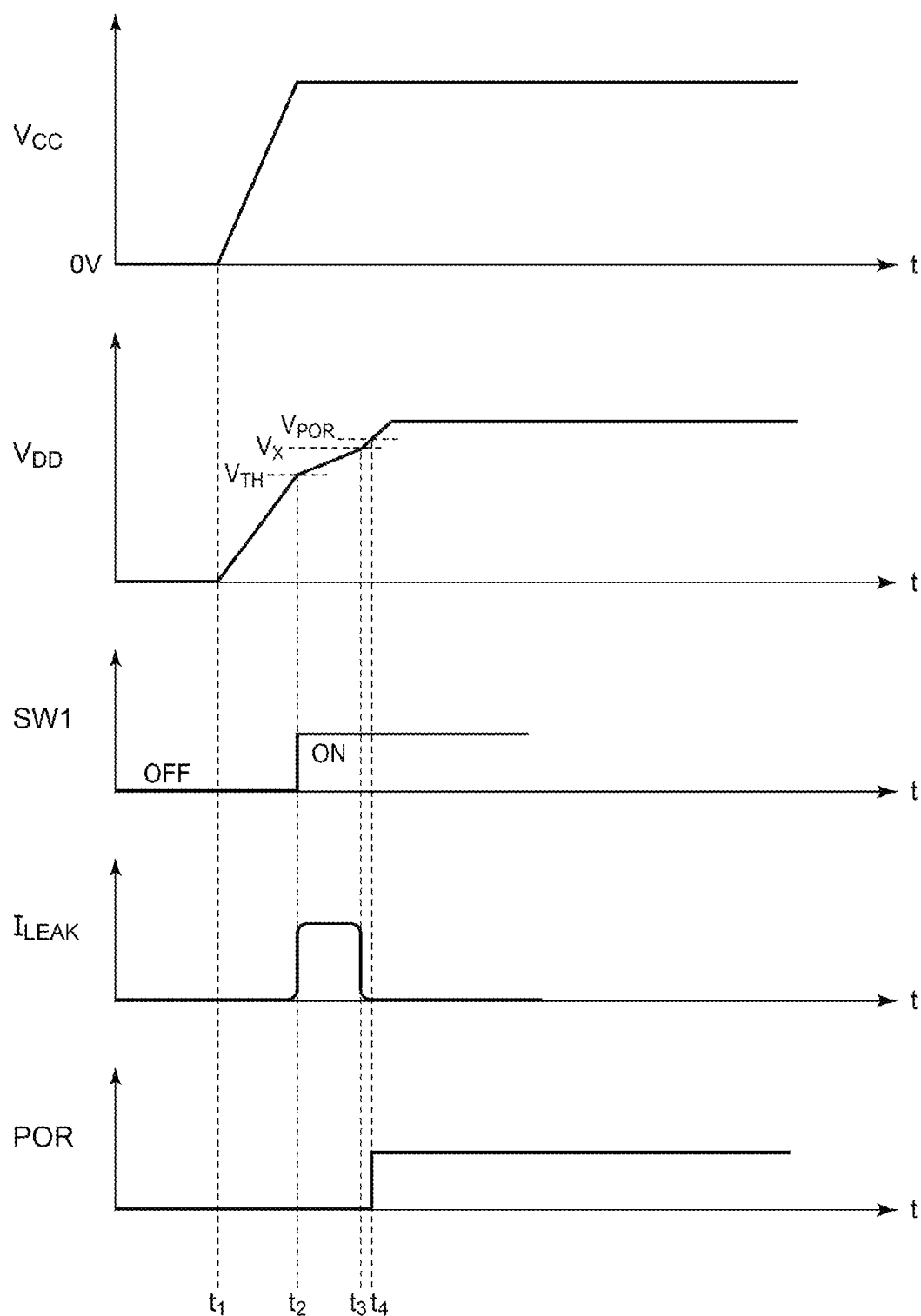
FIG. 4 is a diagram of assistance in explaining a starting operation of the semiconductor apparatus illustrated in FIG. 3.

The above is the configuration of the semiconductor apparatus 100. An operation of the semiconductor apparatus 100 will next be described. FIG. 4 is a diagram of assistance in explaining a starting operation of the semiconductor apparatus 100 in FIG. 3. In the present example, $V_{TH}<Vx$ holds.

The power supply circuit 120 is started when the power supply voltage $V_{CC}$ is supplied to a power supply terminal VCC at time $t_1$. Immediately after the start, $V_{DD}<V_{TH}$ holds, and hence, the switch SW1 is off. Accordingly, all of the current generated by the power supply circuit 120 is supplied to the capacitor C1. The internal power supply voltage $V_{DD}$ thereby rises in a short period of time.

The switch SW1 is turned on when $V_{DD}>V_{TH}$ holds at time $t_2$. The nonvolatile memory 200 is thus supplied with the internal power supply voltage $V_{DD}$. When the internal power supply voltage $V_{DD}$ at this time is lower than the upper limit level Vx of the indeterminate voltage range, the leakage current $I_{LEAK}$ flows to the nonvolatile memory 200. When the leakage current $I_{LEAK}$ flows, the charging speed of the capacitor C1 decreases, and thus, the rising speed of the internal power supply voltage $V_{DD}$ also decreases.

When the internal power supply voltage $V_{DD}$ exits the indeterminate voltage range ($V_{DD}>Vx$) at time $t_3$, the leakage current $I_{LEAK}$ of the nonvolatile memory 200 ceases to flow. The internal power supply voltage $V_{DD}$ is thereafter stabilized to the target level $V_{DD(REF)}$. The POR signal is asserted when the internal power supply voltage $V_{DD}$ exceeds the threshold value voltage $V_{POR}$ of the voltage monitoring circuit 210 at time $t_4$.

The above is an operation of the semiconductor apparatus 100. According to this semiconductor apparatus 100, the starting time of the internal power supply voltage $V_{DD}$ can be shortened greatly as compared with that in the semiconductor apparatus 10 illustrated in FIG. 1. In addition, a period during which the leakage current $I_{LEAK}$ flows can also be shortened greatly, and thus, power consumption can be reduced.

A specific example of the configuration of the semiconductor apparatus 100 will next be described.

Figure 5:
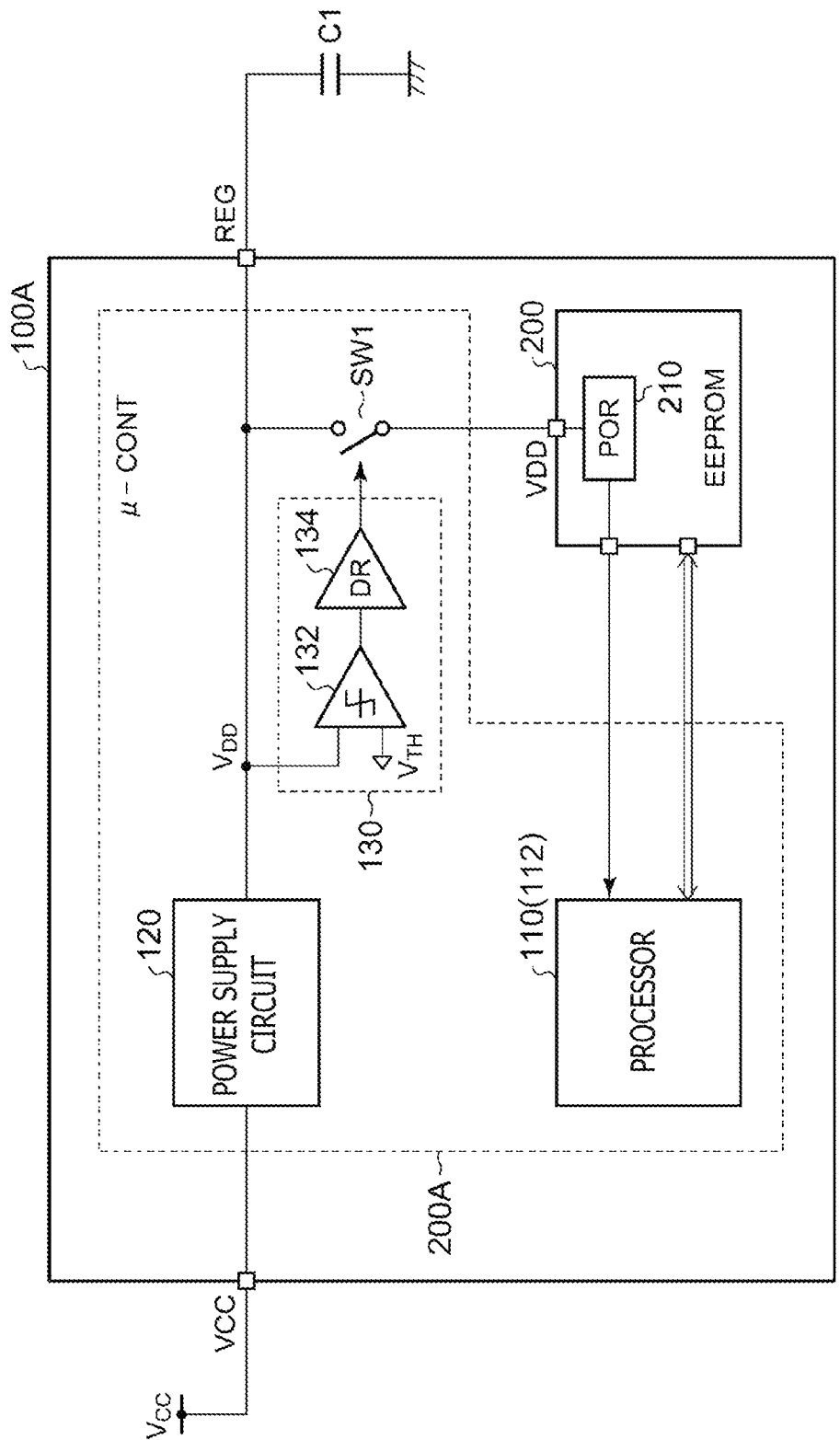
FIG. 5 is a block diagram of a semiconductor apparatus according to a first example.

FIG. 5 is a block diagram of a semiconductor apparatus 100A according to a first example. In the present example, the main circuit 110, the power supply circuit 120, the control unit 130, and the switch SW1 are integrated on one semiconductor chip 200A. For example, the main circuit 110 is a processor 112, and the semiconductor chip 200A is a microcontroller. The nonvolatile memory 200 stores a software program to be executed by the processor 112.

The control unit 130 may include a voltage comparator 132 that compares the internal power supply voltage $V_{DD}$ with the threshold value $V_{TH}$ and a driver 134 that drives the switch SW1 according to the output of the voltage comparator 132.

The processor 112 accesses the nonvolatile memory 200 in response to the assertion of the POR signal, and loads a program from the nonvolatile memory 200.

Figure 6:
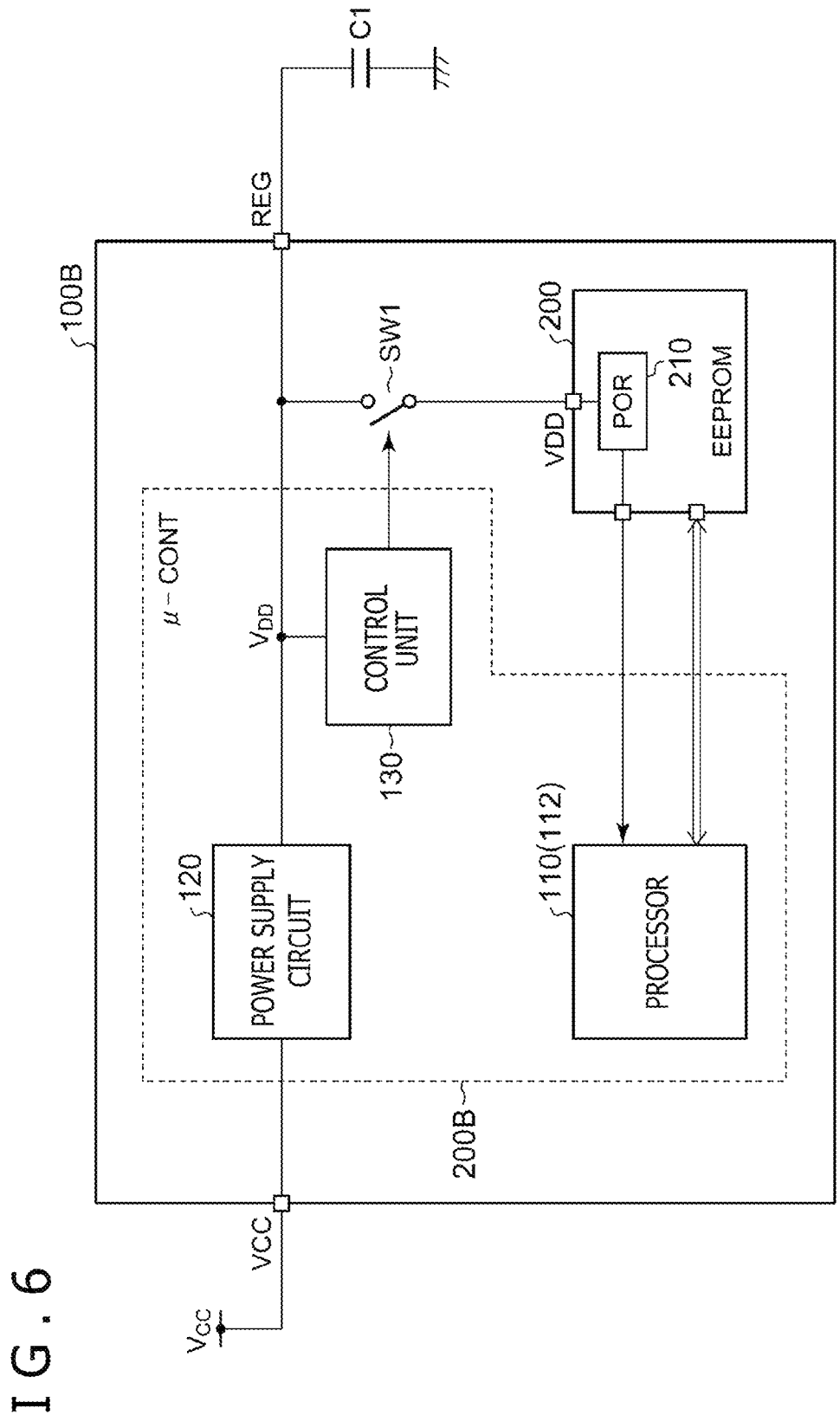
FIG. 6 is a block diagram of a semiconductor apparatus according to a second example.

FIG. 6 is a block diagram of a semiconductor apparatus 100B according to a second example. In the present example, the main circuit 110, the power supply circuit 120, and the control unit 130 are integrated on one semiconductor chip 200B, and the switch SW1 includes an external integrated circuit (IC). As in the first example, the main circuit 110 is a processor 112, and the semiconductor chip 200B is a microcontroller.

Figure 7:
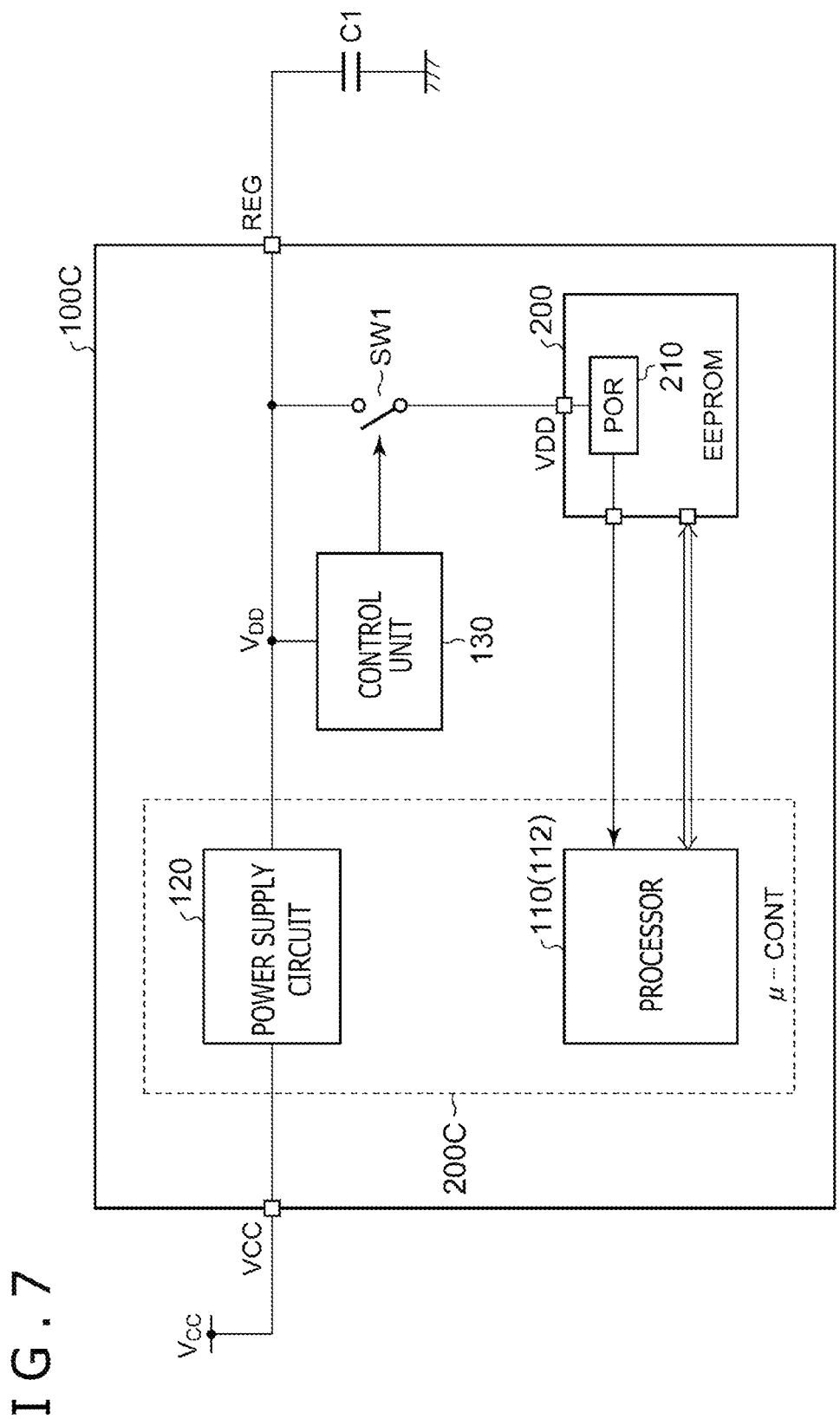
FIG. 7 is a block diagram of a semiconductor apparatus according to a third example.

FIG. 7 is a block diagram of a semiconductor apparatus 100C according to a third example. In the present example, the main circuit 110 and the power supply circuit 120 are integrated on one semiconductor chip 200C, and the switch SW1 and the control unit 130 include one or a plurality of external ICs.

The above is an example of the configuration of the semiconductor apparatus 100. An application of the semiconductor apparatus 100 will next be described.

Figure 8:
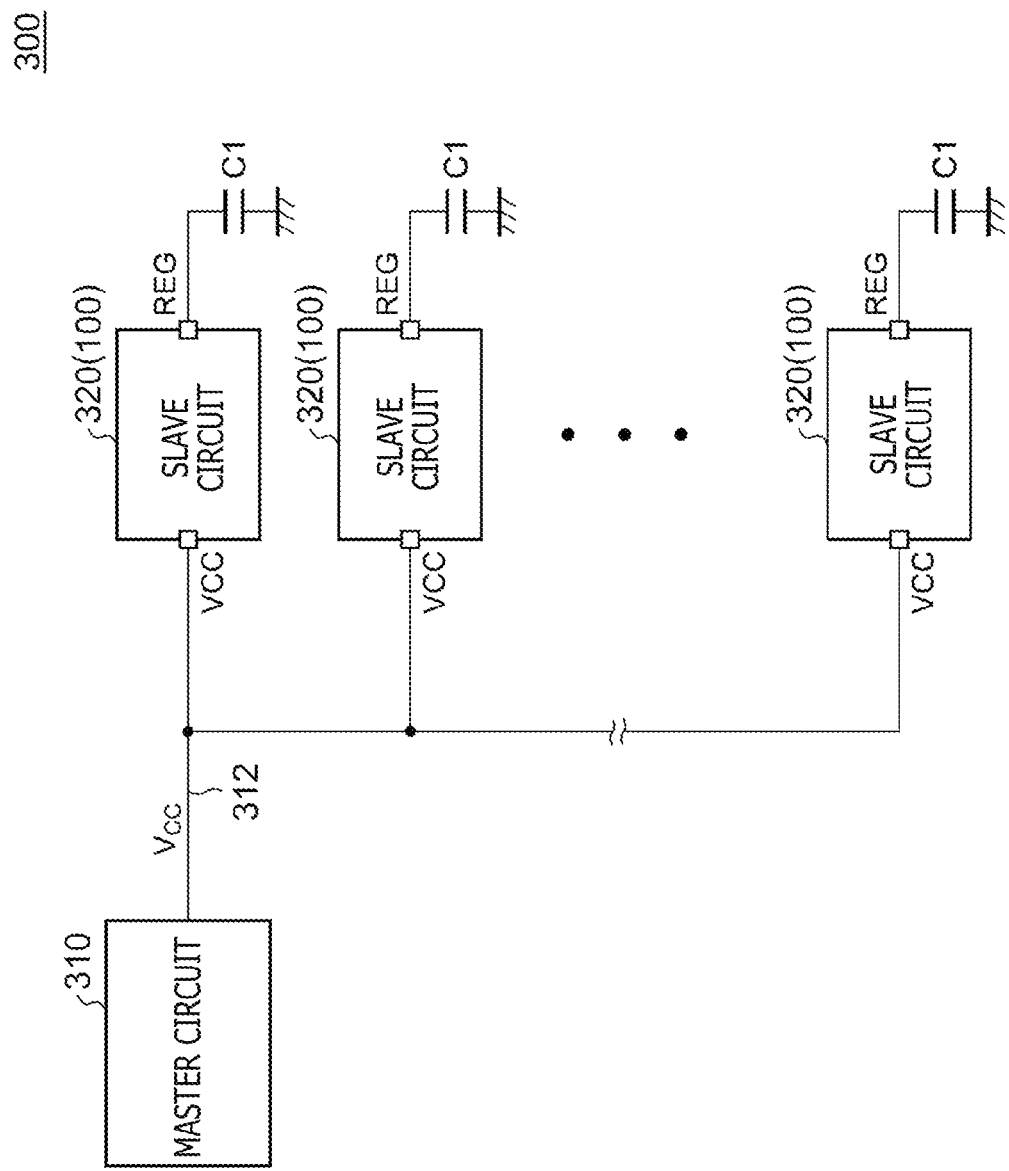
FIG. 8 is a block diagram of a circuit system.

FIG. 8 is a block diagram of a circuit system 300. The circuit system 300 includes one master circuit 310, a power supply line 312, and a plurality of slave circuits 320. The master circuit 310 supplies the power supply voltage $V_{CC}$ to the power supply line 312. Power supply terminals VCC of the slave circuits 320 are connected to the power supply line 312.

The slave circuits 320 correspond to the semiconductor apparatus 100 described above. The slave circuits 320 include a nonvolatile memory.

In a system in which the number of slave circuits 320 is a few hundred to a few thousand, there is a limit to the current that can be supplied to the power supply terminals VCC of the respective slave circuits 320. In addition, when the length of the power supply line 312 is a few hundred m to a few km, the impedance of the power supply line 312 is not negligible, and thus, the current supplied to the power supply terminals VCC of the respective slave circuits 320 is further limited. In such a system, when the slave circuits 320 are constituted by the semiconductor apparatus 10 illustrated in FIG. 1, a leakage current continues to flow in the plurality of slave circuits 320, and thus, the starting of the circuit system 300 takes a very long time. On the other hand, when the slave circuits 320 are constituted by the semiconductor apparatus 100 illustrated in FIG. 3, the leakage currents of the nonvolatile memories are greatly reduced, and thus, the starting time of the circuit system 300 can be shortened.

MODIFICATIONS

The foregoing embodiments are illustrative, and it is understood by those skilled in the art that combinations of constituent elements and processing processes of those embodiments are susceptible of various modifications. Such modifications will be described in the following.

First Modification

In the example of FIG. 4, a setting is made such that $V_{TH}<Vx$ holds. However, a setting may be made such that $V_{TH}>Vx$ holds. In this case, when the switch SW1 is turned on, the internal power supply voltage $V_{DD}$ exceeds the indeterminate voltage range. Thus, there is no period in which a through current flows through the gate element constituting the nonvolatile memory 200, so that power consumption can be further reduced.

Second Modification

In the first to third examples, the main circuit 110 is the processor 112. However, the functions and configuration of the main circuit 110 are not limited to any kind. The main circuit 110 may be an analog circuit, may be a digital circuit, or may be an analog-digital mixed circuit.

The embodiments are illustrative, and it is to be understood by those skilled in the art that there are various modifications to combinations of respective constituent elements and respective processing processes of these embodiments, and that such modifications are also included in the present disclosure and can constitute the scope of the present disclosure.

According to a certain mode of the present disclosure, power consumption can be reduced.

What is claimed is:

1. A semiconductor apparatus comprising:
a power supply pin configured to receive a power supply voltage from an outside;
a capacitor connection pin to be connected with a capacitor;
a power supply circuit having an input connected to the power supply pin and having an output connected to the capacitor connection pin, the power supply circuit being configured to generate an internal power supply voltage at the output of the power supply circuit;
a nonvolatile memory configured to operate by receiving the internal power supply voltage;
a switch disposed between a power supply terminal of the nonvolatile memory and the capacitor connection pin; and
a control unit configured to turn on the switch when the internal power supply voltage exceeds a predetermined threshold value.

2. The semiconductor apparatus according to claim 1, wherein
the power supply circuit, the switch, and the control unit are integrated on one semiconductor chip.

3. The semiconductor apparatus according to claim 2, wherein
the one semiconductor chip is a microcontroller, and
the nonvolatile memory stores a program to be executed by the microcontroller.

4. The semiconductor apparatus according to claim 1, wherein
the power supply circuit and the control unit are included in one microcontroller, and a control signal of the switch, the control signal being generated by the control unit, is output from an input-output terminal of the microcontroller, and the nonvolatile memory stores a program to be executed by the microcontroller.

5. The semiconductor apparatus according to claim 1, wherein the nonvolatile memory includes a voltage monitoring circuit configured to compare the internal power supply voltage with a threshold value voltage, and the threshold value is set higher than 80% of the threshold value voltage of the voltage monitoring circuit.

6. The semiconductor apparatus according to claim 1, wherein the threshold value is variable.

7. The semiconductor apparatus according to claim 1, wherein the nonvolatile memory is an electrically erasable read-only memory.

8. A system comprising:

a power supply line;

a master circuit configured to generate a power supply voltage in the power supply line; and a plurality of slave circuits connected to the power supply line, each of the plurality of slave circuits including line, a power supply pin connected to the power supply capacitor, a capacitor connection pin connected with a capacitor, a power supply circuit having an input connected to the power supply pin and having an output connected to the capacitor connection pin, the power supply circuit being configured to generate an internal power supply voltage at the output of the power supply circuit, a nonvolatile memory, a switch disposed between a power supply terminal of the nonvolatile memory and the capacitor connection pin, and a control unit configured to turn on the switch when the internal power supply voltage exceeds a predetermined threshold value.

9. The system according to claim 8, wherein
the power supply circuit, the switch, and the control unit are integrated on one semiconductor chip.

10. The system according to claim 9, wherein
the one semiconductor chip is a microcontroller, and
the nonvolatile memory stores a program to be executed by the microcontroller.

11. The system according to claim 9, wherein
the power supply circuit and the control unit are included in one microcontroller, and a control signal of the switch, the control signal being generated by the control unit, is output from an input-output terminal of the microcontroller, and
the nonvolatile memory stores a program to be executed by the microcontroller.

12. The system according to claim 8, wherein
the threshold value is variable.

13. The system according to claim 8, wherein
the nonvolatile memory is an electrically erasable read-only memory.

* * * * *